US007011996B2

(12) United States Patent
Okumura et al.

(10) Patent No.: US 7,011,996 B2
(45) Date of Patent: Mar. 14, 2006

(54) METHOD OF MANUFACTURING THIN FILM TRANSISTOR

(75) Inventors: Hiroshi Okumura, Tokyo (JP); Kunihiro Shiota, Tokyo (JP)

(73) Assignees: NEC LCD Technologies, Ltd. (JP); NEC Corporation (JP)

( * ) Notice: Subject to any disclaimer, the term of this patent is extended or adjusted under 35 U.S.C. 154(b) by 173 days.

(21) Appl. No.: 10/444,288

(22) Filed: May 22, 2003

(65) Prior Publication Data

US 2004/0005743 A1 Jan. 8, 2004

(30) Foreign Application Priority Data

May 21, 2002 (JP) ........................... 2002-146918

(51) Int. Cl.
*H01L 21/335* (2006.01)
*H10L 21/8232* (2006.01)

(52) U.S. Cl. ...................................... 438/164
(58) Field of Classification Search ............... 438/142, 438/149, 151, 164, 689, 706, 734, 735, 737, 438/738, 739, 745, 795, 704, 694, 758, 216, 438/412, 479, 486, 487, 585, 591, 761, 906, 438/909, 967
See application file for complete search history.

(56) References Cited

U.S. PATENT DOCUMENTS

| 4,704,784 | A | * | 11/1987 | Szydlo et al. | ........... 438/164 |
| 5,039,621 | A | * | 8/1991 | Pollack | ............ 438/164 |
| 5,120,667 | A | * | 6/1992 | Tarui et al. | ........... 438/164 |
| 5,328,861 | A | * | 7/1994 | Miyakawa | ........... 438/151 |
| 5,470,762 | A | * | 11/1995 | Codama et al. | ........... 438/164 |
| 5,624,861 | A | * | 4/1997 | Shibuya | ............ 438/164 |
| 5,998,838 | A | * | 12/1999 | Tanabe et al. | ........... 257/347 |
| 6,258,638 | B1 | * | 7/2001 | Tanabe et al. | ........... 438/163 |
| 6,403,409 | B1 | * | 6/2002 | You | ................ 438/164 |
| 6,444,507 | B1 | * | 9/2002 | Miyasaka | ........... 438/164 |
| 6,444,508 | B1 | * | 9/2002 | Tanabe et al. | ........... 438/164 |
| 6,703,267 | B1 | * | 3/2004 | Tanabe et al. | ........... 438/164 |
| 6,737,302 | B1 | * | 5/2004 | Arao | ............... 438/149 |
| 2002/0192885 | A1 | * | 12/2002 | Miyasaka | ........... 438/164 |

FOREIGN PATENT DOCUMENTS

KR    2000-018289    4/2000

OTHER PUBLICATIONS

Japanese translation of Korean Office action prepared by Korean associate and sent to Japanese associate.
Untranslated Korean Office Action issued on May 16, 2005 in connection with corresponding Korean application No. 10-2003-0031832.
English translation of relevant portions of Korean Patent Office Action issued May 16, 2005 submitted in lieu of statement of relevancy of prior art teachings to the instant application.

* cited by examiner

*Primary Examiner*—Olik Chaudhuri
*Assistant Examiner*—Michael K. Luhrs
(74) *Attorney, Agent, or Firm*—Ostrolenk, Faber, Gerb & Soffen, LLP

(57) ABSTRACT

After a polysilicon semiconductor film 5 and a first gate oxide film 6 are formed on a transparent insulating substrate 1, the semiconductor film 5 and the first gate oxide film 6 are patterned into an island shape to form an island part. At this time, an overhang part 8 of a visor shape is formed where side end surfaces of the first gate oxide film 6 and the semiconductor film 5 are not aligned and an end part of the first gate oxide film 6 projects slightly from a position of a side end surface of the semiconductor film 5. The overhang part 8 is removed, for example, during cleaning, which thus enhances yield.

18 Claims, 6 Drawing Sheets

METHOD OF MANUFACTURING THIN FILM TRANSISTOR

BACKGROUND OF THE INVENTION

1. Field of the Invention

The present invention relates to a method of manufacturing a thin film transistor (hereinafter referred to as TFT) of a top gate type, which is, for example, used as a switching element and the like in a liquid crystal display or organic EL (Electroluminescent) display and is formed of polysilicon on an insulating substrate.

2. Description of the Related Art

A liquid crystal display is manufactured, for example, by encapsulating liquid crystals into a clearance between a TFT substrate and a CF (Color Filter) substrate to make a liquid crystal display panel, thereafter connecting it to a TCP (Tape Carrier Package) mounted with a drive IC for driving the liquid crystal display panel and further connecting the TCP to a wiring board for supplying signals and power.

In recent years, reduction of a size and thickness has been required in a liquid crystal display of an active matrix type. To this end, several attempts have been made to configure a drive circuit by using TFTs, in addition to forming TFTs as switching elements on the TFT substrate. Polysilicon TFTs have each a semiconductor film of polysilicon with high carrier mobility and are effective to increase operation speed when they are used as thin film elements of the drive circuit. Therefore, the polysilicon TFTs are now being developed prevalently.

In the Japanese Patent No. 3185759 and the Japanese Patent Laid-Open No. 10-116989, for example, a technique is disclosed in which a first gate insulating film of silicon oxide is formed via an underlying insulating film on a polysilicon semiconductor film formed on a transparent insulating substrate, and then the semiconductor film and the first gate insulating film are etched and patterned together into island shape. Thereafter, a second gate insulating film of silicon oxide is formed on the first gate insulating film having island shape. This method effectively serves to reduce a chance of exposing the polysilicon semiconductor film to an outside air or atmosphere, protect it from contaminants, and to obtain a clean interface (between polysilicon semiconductor film and the silicon oxide film).

With this method, high carrier mobility of the polysilicon TFT and high uniformity thereof without variations can be achieved in the same substrate and between substrates.

More specifically, as shown in FIG. 1A, an underlying protection film 102 of silicon oxide ($SiO_2$) is formed on a transparent insulating substrate 101 made of glass, and an amorphous silicon (a-Si) semiconductor film is formed on the underlying protection film 102. Next, excimer laser light is irradiated and scanned onto the semiconductor film to reform it polycrystalline. Thus, a polysilicon (p-Si) semiconductor film 103 is formed, on which a first gate oxide film 104 of silicon oxide is also formed.

Next, by using photolithography technique, the polysilicon semiconductor film 103 and the first gate oxide film 104 are etched and pattered together into an island shape so as to form an island part 105 as shown in FIG. 1B.

When the island part 105 is formed by etching, selectivity of polysilicon and silicon oxide (defined by an etching speed of polysilicon/an etching speed of silicon oxide) is set to a comparatively high value.

The reason why the high value is set as the selectivity is because, when the selectivity is comparatively low, the silicon oxide of the underlying protection film 102 is etched excessively and, as a result, the island part 105 has a wide step due to an undercut part 106 shown in FIG. 2. Such a step results in disconnection of electrodes formed in the subsequent process or deterioration of yield due to a leak current flowing between the electrodes and the semiconductor film 103. Furthermore, an undulation part 107 is formed on the surface of the underlying protection film 102 and lowers light transmittance of the transparent insulating substrate 101. This brings about degradation of the quality of liquid crystal displays when such an undulated transparent insulating substrate 101 is used.

After the above processing, as shown in FIG. 1C, a second gate oxide film 108 of silicon oxide is formed on the transparent insulating substrate 101 with the semiconductor film 103 and the first gate oxide film 104. Next, a conductive film composed of tantalum and the like is formed above the second gate oxide film 108 by spattering and the like, and is then patterned using photolithography technique to form a gate electrode 109 on the second gate oxide film 108, as shown in FIG. 1D.

Next, by using the gate electrode 109 as a mask, an impurity ion such as a phosphorus ion is implanted into the polysilicon semiconductor film 103 to form source/drain areas. Then, an interlayer insulating film 110 of silicon oxide is formed, as shown in FIG. 1D.

Next, as shown in FIG. 1E, contact holes are formed and thereafter, source/drain electrodes 111 are formed to be connected to the source/drain areas.

In the conventional technique described above, however, the comparatively high selectivity of the polysilicon and silicon oxide in dry etching to form the island part 105 results in the formation of an overhang part 105a shown in FIG. 1B. At the overhang part 105a, an end portion or part of the first gate oxide film 104 projects outwardly from an end surface of the semiconductor film 103. Under the circumstances, when the second gate oxide film 108 is formed in this status, coverage becomes insufficient on the side walls of the island part 105, as shown in FIG. 1C.

This phenomenon occurs also when the interlayer insulating film 110 and the source/drain electrodes 111 are formed, as shown in FIGS. 1D and 1E. Therefore, there is a disadvantage that disconnection or connection failures of electrodes unfavorably take place and thus the yield is deteriorated because of defective transistors.

To overcome the disadvantage, the Japanese Patent Laid-Open No. 2001-332741 proposes another technique in which, after the semiconductor film 103 and the first gate oxide film 104 are etched together into island shape, the first gate oxide film 104 is removed, and then the second gate oxide film 108 is formed. However, there still exists a disadvantage that contamination is not avoidable on the surface of the semiconductor film 103 because the semiconductor film 103 is not covered until the second gate oxide film 108 is formed.

SUMMARY OF THE INVENTION

It is therefore an object of the present invention to provide a method of manufacturing a TFT which can provide a clean interface between polysilicon and silicon oxide, which can thereby achieve high carrier mobility and high uniformity thereof without any overhang part formed in an island forming process, and which can accomplish a high yield.

According to a first aspect of the invention, there is provided a method of manufacturing a thin film transistor, which includes a step of forming a first insulating film on a semiconductor film formed on a substrate; a step of forming an island by patterning the semiconductor film and the first insulating film into island shape; a step of forming a second insulating film on the island; and a step of forming a gate electrode on the second insulating film, characterized by comprising a step of removing an overhang part where a side end part of the first insulating film making the island is formed into visor shape over a side end part of the semiconductor film, the step of removing the overhang part being performed after the step of forming the island and before the step of forming the second insulating film.

According to a second aspect of the invention, there is provided a method characterized in that in the step of removing the overhang part, the overhang part is removed by using a chemical cleaning liquid.

According to a third aspect of the invention, there is provided a method of manufacturing the thin film transistor characterized in that in the step of removing the overhang part, the overhang part is removed by cleaning the substrate having the formed island for a time period from 1 to 60 seconds using an aqueous hydrofluoric acid solution of concentration ranging from 0.01% to 10% as the chemical cleaning liquid.

According to a fourth aspect of the invention, there is provided a method of manufacturing the thin film transistor characterized in that in the step of removing the overhang part, of the first insulating film, there is left at least a region corresponding to a lower part of an area where the gate electrode is formed in the step of forming the gate electrode.

According to a fifth aspect of the invention, there is provided a method of manufacturing a thin film transistor, which include a step of forming a first insulating film on a semiconductor film formed on a substrate; a step of forming an island by patterning the semiconductor film and the first insulating film into island shape; a step of cleaning the substrate on which the island is formed; a step of forming a second insulating film on the island; and a step of forming a gate electrode on the second insulating film, characterized in that in the step of cleaning, an overhang part, where a side end part of the first insulating film making the island is formed into visor shape over a side end part of the semiconductor film, is removed simultaneously with cleaning processing.

According to a sixth aspect of the invention, there is provided a method of manufacturing the thin film transistor characterized in that in the step of cleaning, the overhang part is removed by using a chemical cleaning liquid.

According to a seventh aspect of the invention, there is provided a method of manufacturing the thin film transistor characterized in that in the step of cleaning, the overhang part is removed by cleaning the substrate having the formed island for a time period from 1 to 60 seconds using an aqueous hydrofluoric acid solution of concentration ranging from 0.01% to 10% as the chemical cleaning liquid.

According to an eighth aspect of the invention, there is provided a method of manufacturing the thin film transistor characterized in that in the step of cleaning, of the first insulating film, there is left at least a region corresponding to a lower part of an area where the gate electrode is formed in the step of forming the gate electrode.

According to a ninth aspect of the invention, there is provided a method of manufacturing the thin film transistor characterized in that the semiconductor film comprises a polycrystalline semiconductor.

According to a tenth aspect of the invention, there is provided a method of manufacturing the thin film transistor characterized by comprising a semiconductor film forming step, which includes a non-single crystal semiconductor film forming step of forming a semiconductor film of a non-single crystal semiconductor on the substrate and an annealing step of crystallizing the semiconductor film of the non-single crystal semiconductor to form the semiconductor film of the polycrystalline semiconductor through annealing processing.

According to an eleventh aspect of the invention, there is provided a method of manufacturing the thin film transistor characterized in that the non-single crystal semiconductor includes an amorphous semiconductor.

According to a twelfth aspect of the invention, there is provided a method of manufacturing the thin film transistor characterized in that in the annealing step, the semiconductor film of the polycrystalline semiconductor is formed by irradiating the semiconductor film of the non-single crystal semiconductor with laser light.

According to a thirteenth aspect of the invention, there is provided a method of manufacturing the thin film transistor characterized in that from start of the annealing step until end of the step of forming the first insulating film, predetermined processing is performed in a separated state from an outside air.

BRIEF DESCRIPTION OF THE DRAWINGS

FIG. 5 is a schematic diagram showing a constitution of a TFT manufacturing apparatus which is used for manufacturing the TFT and which film deposition and laser irradiation to a transparent insulating substrate are performed in;

DESCRIPTION OF THE PREFERRED EMBODIMENTS

The preferred embodiments of the present invention will be described below.

Embodiments

Firstly, description will be made about a method of manufacturing a TFT, which is one embodiment of the present invention.

In the method of manufacturing a TFT according to the embodiment, a first insulating film is formed in a first insulating film forming process on a semiconductor film which is formed on a substrate, and then the semiconductor film and the first insulating film are patterned into island shape in an island forming process. Thereafter, an overhang part removal process or a cleaning process is carried out. In the overhang part removal process or the cleaning process, the overhang part, where a side end part of the first insulating film making the island is formed into a visor shape over a side end part of the semiconductor film, is removed. After this, a second insulating film is formed on the island in the second insulating film forming process, and a gate electrode is formed on the second insulating film in a gate electrode forming process.

This allows complete removal of the overhang part which is formed in the island forming process, and yield can be thus enhanced.

First Embodiment

Next, a method of manufacturing a TFT will be described with reference to drawings according to a first embodiment of the present invention.

Figure 1A:
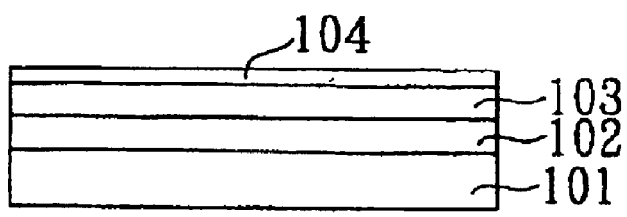
FIGS. 1A to 1E show sectional views for describing a conventional method.
Figure 1B:
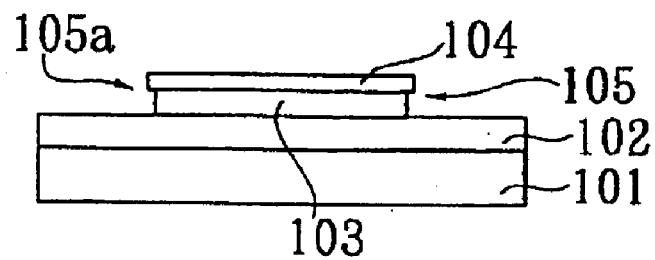
Figure 1C:
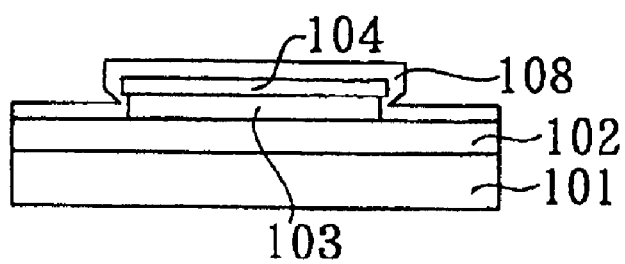
Figure 1D:
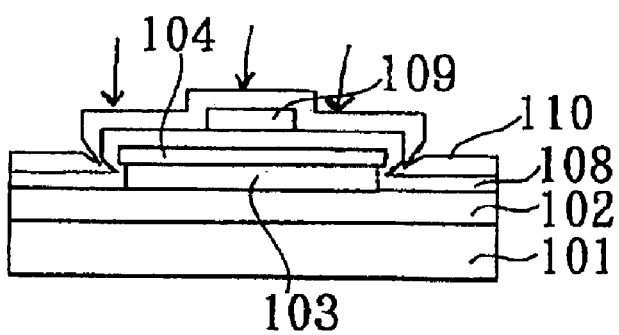
Figure 1E:
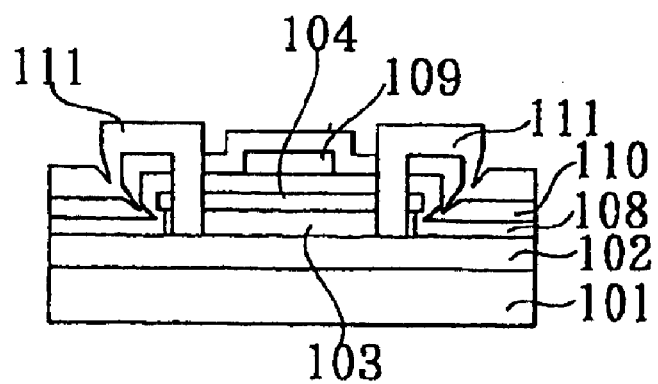
Figure 2:
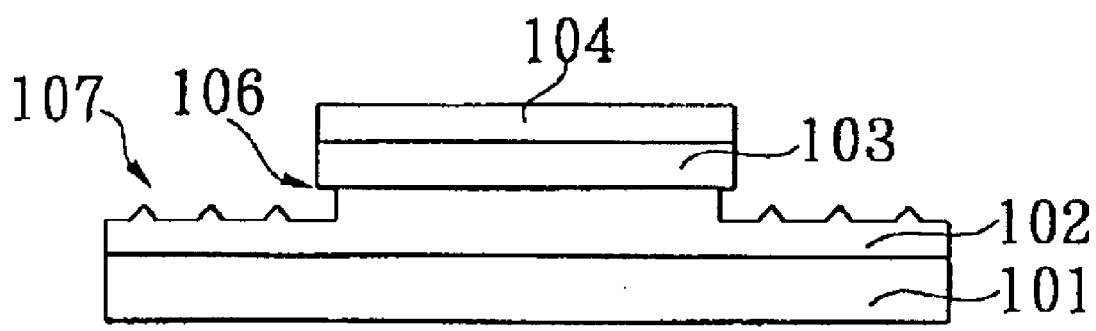
FIG. 2 shows an enlarged sectional view for describing the conventional method.
Figure 5:
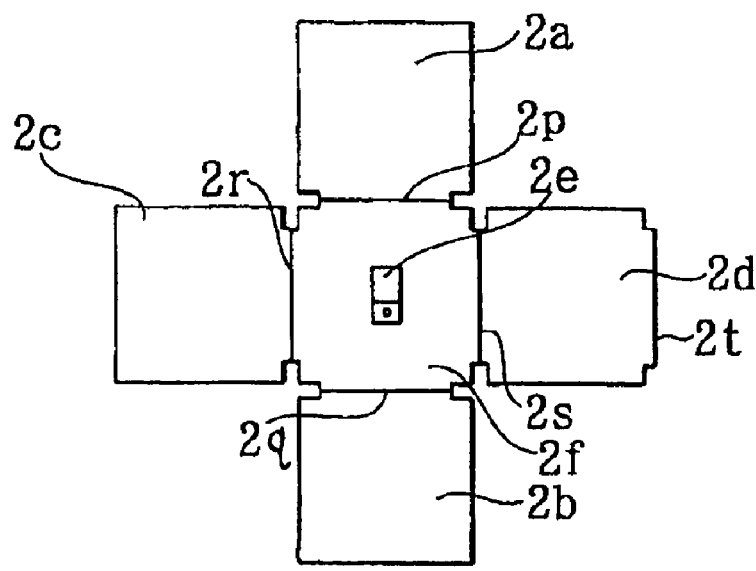
Figure 6:
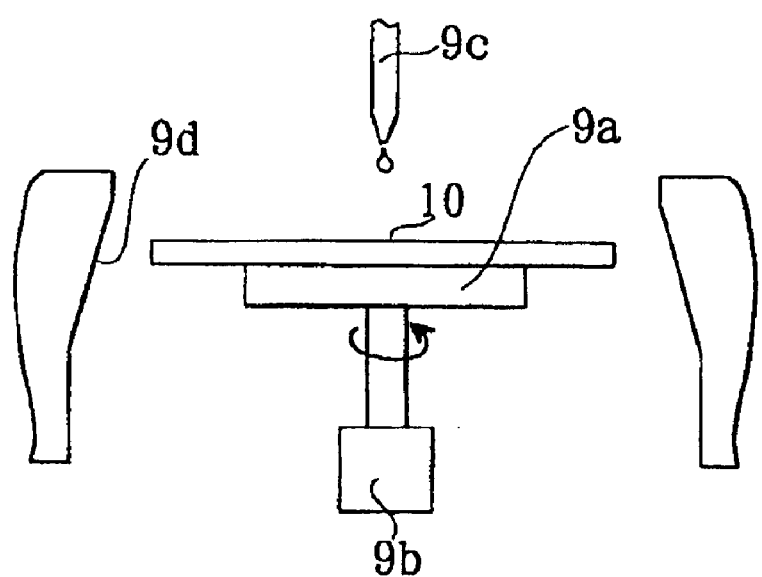
FIG. 6 is a schematic diagram showing a constitution of a spin cleaning apparatus used for manufacturing the TFT.

FIGS. 1 and 2 are process diagrams illustrating the method of manufacturing a TFT according to the first embodiment of the present invention, FIG. 5 is a schematic diagram of a constitution of a TFT manufacturing apparatus which is used for manufacturing the TFT and in which film deposition and laser irradiation to the transparent insulating substrate are performed, and FIG. 6 is a schematic diagram of a constitution of a spin cleaning apparatus used for manufacturing the TFT.

In the method of manufacturing the TFT in this example, prepared is a transparent insulating substrate (substrate) 1 made of glass which is cleaned by ultrasonic cleaning or the like, for example, OA-10 of Nippon Electric Glass Co., Ltd, as shown in FIG. 1A. Next, the transparent insulating substrate 1 is introduced into the TFT manufacturing apparatus 2 for manufacturing the TFT.

As shown in FIG. 5, the TFT manufacturing apparatus 2 is so constituted that a plurality of chambers are coupled with each other in which an object to be processed is subjected to respective predetermined processings, such chambers including a semiconductor film deposition part 2a for forming a semiconductor film on the transparent insulating substrate 1; an insulator film deposition part 2b for forming a silicon oxide film; a laser irradiation part 2c for irradiating the object to be processed with a laser; and an introducing part 2d for introducing the object to be processed such as the transparent insulating substrate 1 into a main unit of the TFT manufacturing apparatus from outside and removing it after the predetermined processings, all of which are disposed around a conveying part 2f provided thereon with a conveying device 2e.

The conveying part 2f and each of the semiconductor film deposition part 2a, the insulator film deposition part 2b, the laser irradiation part 2c, and the introducing part 2d is divided so as to be freely opened and closed by shutters 2p, 2q, 2r, and 2s, respectively, and the object to be processed is conveyed by the conveying device 2e between the conveying part 2f and each of the semiconductor film deposition part 2a, the insulator film deposition part 2b, the laser irradiation part 2c, and the introducing part 2d. The introducing part 2d is provided with a delivery port for the object to be processed to/from the main unit of the TFT manufacturing apparatus, which is openable and closable by a shutter 2t.

Figure 3A:
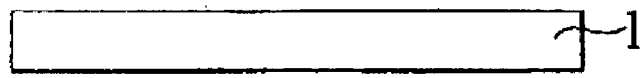
FIGS. 3A to 3G show process diagrams illustrating a method of manufacturing a TFT according to a first embodiment of the present invention.

After the transparent insulating substrate 1 is introduced into the TFT manufacturing apparatus 2, as shown in FIG. 3A, in the insulator film deposition part 2b, an underlying protection film 3 of silicon oxide (SiO2) with thickness of, for example, 1000 Å (100 nm), is formed on the transparent insulating substrate 1 by Plasma Enhanced Chemical Vapor Deposition (hereinafter referred to as PECVD) technique. The underlying protection film 3 is provided in order to prevent separation caused from the diffusion of impurities such as a heavy metal from the transparent insulating substrate 1.

In this example, the film deposition is performed under the following condition: pressure (degree of vacuum) of 150 Pa, substrate temperature of 350° C., gas introduction of $SiH_4$ of 200 sccm (standard cubic centimeter per minute), which means 200 cc/min (200 cm$^3$/min) at conversion in a standard state, $N_2O$ of 3000 sccm, and He of 100 sccm as material gases, and RF (Radio Frequency) power output of 1000 W.

Figure 3B:
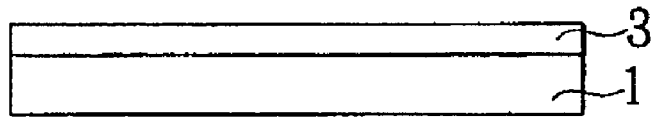
Figure 3C:
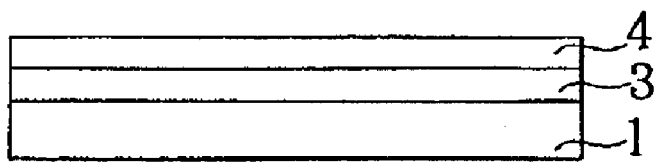

Next, as shown in FIG. 3A, the transparent insulating substrate 1, on which the underlying protection film is formed, is transferred into the semiconductor film deposition part 2a, and in succession to the film deposition of the underlying protection film 3 (FIG. 3B), an amorphous silicon (a-Si) semiconductor film 4 with thickness of, for example, 500 Å (50 nm), is formed on the underlying protection film 3 (FIG. 3C) by PECVD.

In this example, the film deposition is performed under the following condition: pressure of 50 Pa, substrate temperature of 400° C., gas introduction of $SiH_4$ of 140 sccm and Ar of 80 sccm as material gases, and RF power output of 120 W.

Next, the transparent insulating substrate 1 having the underlying protecting film 3 and the semiconductor film 4 undergoes a dehydrogenation treatment in which the transparent insulating substrate 1 is kept at 500° C. for 10 min.

Figure 3D:
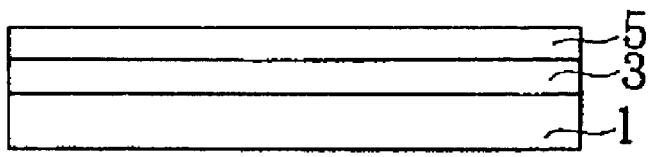

Next, as shown in FIG. 3D, excimer laser light A is scan-irradiated on the amorphous silicon semiconductor film 4 in the laser irradiation part 2c to make it polycrystalline, and then a polysilicon (p-Si) semiconductor film 5 is formed.

In this example, an energy density is set to 400 mJ/cm$^2$, and a scan overlapping rate is set to 90% of beam width for example.

Figure 3E:
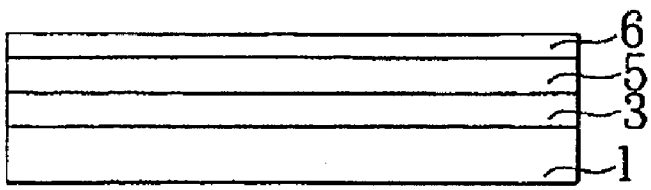

Next, as shown in FIG. 3E, a first gate oxide film (first insulating film) 6 of silicon oxide with thickness of, for example, 200 Å (200 nm), is formed on the polysilicon semiconductor film 5 by PECVD.

In this example, the film deposition is performed under the following conditions: pressure of 110 Pa, substrate temperature of 380° C., gas introduction of TEOS of 180 sccm, $O_2$ of 3500 sccm, and He of 100 sccm as material gases, and RF power output of 1000 W.

Next, an island forming process is performed to the semiconductor film 5 and the first gate oxide film 6.

Figure 3F:
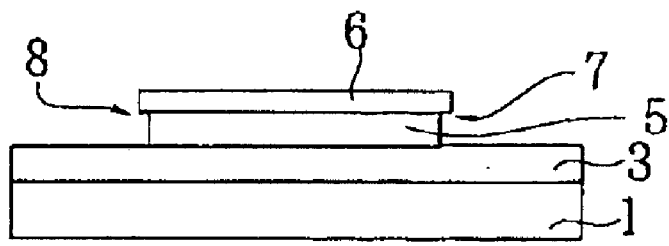
Figure 3G:
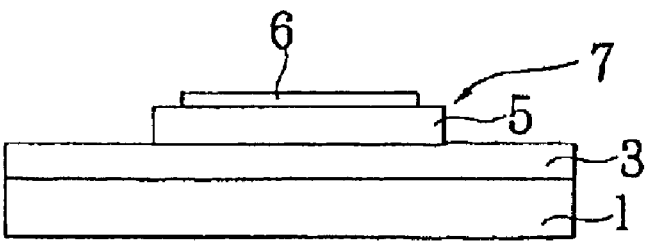

More specifically, the transparent insulating substrate 1 having the semiconductor film 5 and the first gate oxide film 6 is removed from the TFT manufacturing apparatus 2, and a resist mask with a predetermined mask pattern is formed on the surface of the first gate oxide mask 6. Using photolithography technique, the polysilicon semiconductor film 5 and the first gate oxide film 6 are etched together by dry etching and pattered into island shape to form an island part 7 as shown in FIG. 3F.

In this example, the selectivity of the polysilicon and silicon oxide (etching speed of polysilicon/etching speed of silicon oxide) is changed in the middle of forming the island part 7, which means that etching is performed in two stages of different etching conditions.

More specifically, the selectivity of etching the first gate oxide film 6 and etching the polysilicon semiconductor film 5 in a region within approximately 400 Å (40 nm) in depth from its surface is set to, for example, 1, whereas the selectivity of etching the semiconductor film 5 in a region deeper than approximately 400 Å (40 nm) from its surface is set to, for example, 20.

The etching selectivity of a large portion etched from the start until the time immediately before the end of etching in the island forming process, that is, the selectivity of etching the first gate oxide film 6 and of etching the polysilicon semiconductor 5 in the region within approximately 400 Å

(40 nm) in depth from its surface, is set to an etching condition such that the silicon oxide and polysilicon are etched promptly and the formation of the overhang part in the foregoing description is suppressed.

In addition, the selectivity of etching the remaining part until the end of etching after the selectivity is changed in the island forming process, that is, the selectivity of etching the semiconductor film 5 in the region deeper than approximately 400 Å (40 nm) from its surface, is set to an etching condition such that only the polysilicon is etched preventing the silicon oxide of the underlying protection film 3 from being etched and the generation of, for example, the undercut in the foregoing description, is avoided.

Accordingly, the formation of the overhang part is restrained compared to the conventional technique, while a slight projection is observed. That is, as shown in FIG. 3F, an overhang part 8 of a visor shape is formed where the side end surface of the first gate oxide film 6 and that of the semiconductor film 5 are not aligned and the end part of the first gate oxide film 6 projects by approximately 2 μm from a position of the side end surface of the semiconductor film 5. The overhang part 8 is removed simultaneously with cleaning in a cleaning/overhang part removal process which is subsequently performed.

Next, the cleaning/overhang part removal process is performed using a spin cleaning apparatus 9. The spin cleaning apparatus 9 includes, as shown in FIG. 6, a substrate chuck 9a for vacuum-sucking a transparent insulating substrate 10 on which the island part 7 is formed; an AC servomotor 9b for rotationally driving the substrate chuck 9a around a rotational shaft; and a dispenser part 9c for dropping a cleaning liquid.

The spin cleaning apparatus 9 subjects the transparent insulating substrate 10 having the island part 7 to spin-cleaning using a hydrofluoric acid (HF) solution as the cleaning liquid to remove the overhang part 8 as well as dust. In this context, cleaning conditions, including a concentration and drop time of the aqueous hydrofluoric acid solution, and the number of rotations (rotational speed) of the transparent insulating substrate 1, are set optimally.

For example, the spin cleaning is performed dropping the aqueous hydrofluoric acid solution of concentration 1% for 30 sec. from above the transparent insulating substrate 1 having the semiconductor 5 and the first gate oxide film 6, and rotating the transparent insulating substrate 1 at a rotational speed of 200 rpm.

Of the concentration and drop time of the aqueous hydrofluoric acid solution, and the rotational speed of the transparent insulating substrate 1, when only the drop time is changed to 40 sec., the first gate oxide film 6 is completely removed. Also when only the concentration of the aqueous hydrofluoric acid solution is changed to 3%, the first gate oxide film 6 is completely removed.

When the number of rotations of the transparent insulating substrate 1 is lowered than 200 rpm without changing the concentration and drop time of the aqueous hydrofluoric acid solution, the aqueous hydrofluoric acid solution as the cleaning liquid is liable to stay on the transparent insulating substrate 1, which increases the etching rate to the first gate oxide film 6 but causes a lowering of the removal effect of dust.

On the contrary, when the number of rotations is increased, the removal effect of dust is enhanced, although the etching rate is lowered and the cleaning liquid discharged to the outside of the transparent insulating substrate 1 rebounds from apparatus inner walls 9d in FIG. 6 returning back together with dust and adheres again to the transparent insulating substrate 1. This increases the etching rate in a peripheral part of the transparent insulating substrate 1, and the uniformity of the etching rate in the substrate is consequently impaired.

Accordingly, by selecting optimum cleaning conditions, the overhang part is removed and the end surface of the first gate oxide film 6 is retracted by approximately 3 μm from the side end surface of the semiconductor film 5 to the center thereof, as shown in FIG. 1G.

In addition, with the thickness of the first gate oxide film 6 at the film deposition and under the above cleaning conditions, the first gate oxide film 6 is etched so that it may remain with predetermined thickness (approximately 30 Å (3 nm) in this example), at least in a region directly under a gate electrode 12 which is formed in the subsequent process, that is, in a region directly above an area functioning as a channel of the semiconductor film 5.

Figure 4A:
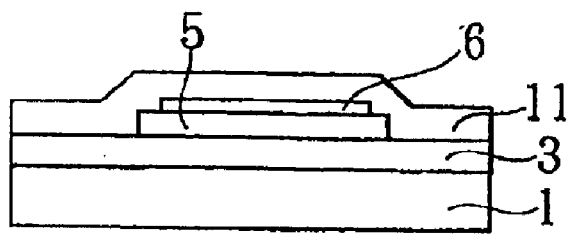
FIGS. 4A to 4E show process diagrams illustrating the method of manufacturing the TFT.

Next, as shown in FIG. 4A, a second gate oxide film (second insulating film) 11 with thickness of, for example, 600 Å (60 nm), is formed on the transparent insulating substrate 1 having the semiconductor film 5 and the first gate oxide film 6 by PECVD. This allows the silicon oxide film to cover the side surface portion as well as the top surface portion of the polysilicon semiconductor film 5, and an electrical insulating property is thereby maintained.

Figure 4B:
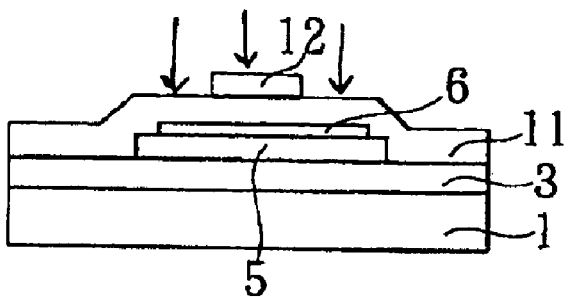

Next, a conductive film composed of tantalum and the like is formed from above the second gate oxide film 11 by spattering or the like, and is then patterned using photolithography technique to form the gate electrode 12 on the second gate oxide film 11, as shown in FIG. 4B.

Figure 4C:
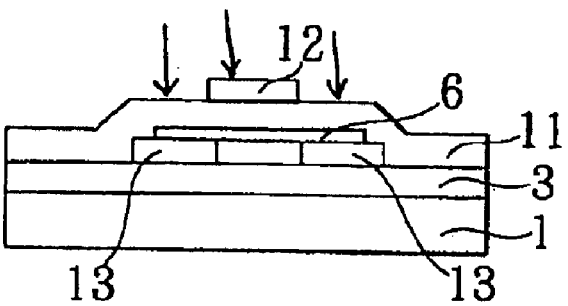

Next, using the gate electrode 12 as a mask, an impurity ion such as a phosphorus ion is implanted into the polysilicon semiconductor film 5 to form source/drain areas 13, as shown in FIG. 4C.

Figure 4D:
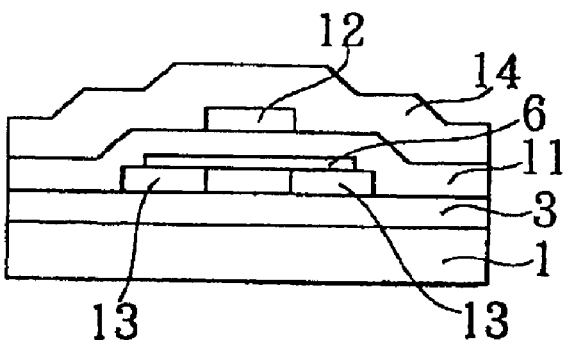

Next, an interlayer insulating film 14 of silicon oxide is formed by PECVD, as shown in FIG. 4D.

Figure 4E:
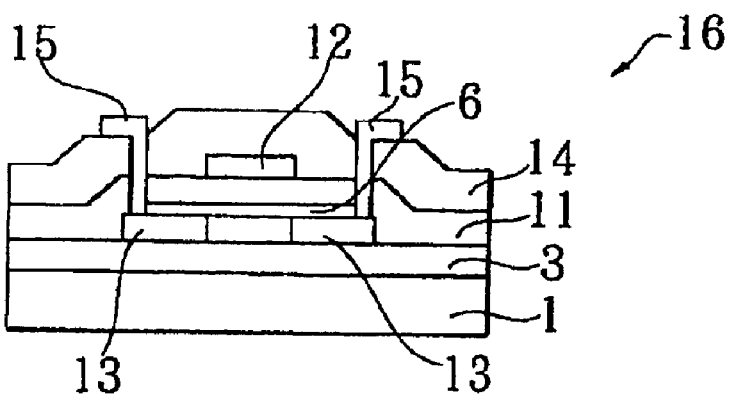

Next, contact holes are formed, after which source/drain electrodes 15 are formed connected to the source/drain areas 13 (as in FIG. 4E).

The transparent insulating substrate 1 on which plural top gate TFTs 16 has been formed is thus obtained. These TFTs 16 are used, for example, as a switching element or part of a drive circuit in the active matrix of transmission type liquid crystal displays. When the TFT 16 is used as a switching element, the gate electrode 11 is connected to a scanning line, and the source/drain electrodes 15 are connected a signal line.

Measurement of carrier mobility in the transparent insulating substrate 1 having the TFTs 16 provides an excellent result of 320 $cm^2$/Vs on the average. In addition, calculation of standard deviation/average value for evaluation of less variations (uniformity) of the mobility in the transparent insulating substrate 1 provides a result of 5% or below. Furthermore, a yield of 99% or more is attained.

Thus, according to the constitution in this example, the overhang part 8 formed in the island forming process can positively be removed by using the spin cleaning apparatus 9 in the cleaning/overhang part removal process, thus enhancing the yield.

Besides, the semiconductor film 4 and the first gate oxide film 6 having a function of protecting the semiconductor film 4 are etched together to form the island part, and a clean interface between polysilicon and silicon oxide is formed, so that high carrier mobility and high uniformity thereof can be achieved.

Moreover, from the process of forming the underlying protection film 3 on the transparent insulating substrate 1 until the process of forming the first gate oxide film 6 on the transparent insulating substrate 1 having the polysilicon semiconductor film 5, the transparent insulating substrate 1 is processed without being exposed to the outside air, so that the interface between the polysilicon and the silicon oxide can be maintained cleanly.

Furthermore, in the cleaning/overhang part removal process, the overhang part 8 is removed simultaneously with cleaning, which eliminates a special process as well as additional time for only removing the overhang part 8. Therefore, the time necessary to manufacture TFTs can be reduced.

Second Embodiment

FIG. 7 is a process diagram illustrating a method of manufacturing a TFT, which is a second embodiment of the present invention.

The example here is considerably different from the first embodiment in that, in contrast that the film deposition and the laser irradiation to the transparent insulating substrate are performed in the TFT manufacturing apparatus without exposing the transparent insulating substrate to the outside air, such film deposition and laser irradiation are performed in different apparatus, and that the transparent insulating substrate having the island part is only immersed in the aqueous hydrofluoric acid solution in substitution for the spin-cleaning in the cleaning/overhang part removal process.

The constitution other than this is substantially the same as that of the first embodiment described above, and explanation thereof will thus be simplified.

In this example, the film deposition of the underlying protection film and the semiconductor film onto the transparent insulating substrate are performed by a Low Pressure Chemical Vapor Deposition (hereinafter referred to as LPCVD) apparatus employing LPCVD technique, and the film deposition of the first gate oxide film onto the transparent insulating substrate having the island part is performed by a PECVD apparatus employing PECVD technique. The laser irradiation to the amorphous silicon semiconductor film to form the polysilicon semiconductor film is performed by a dedicated laser irradiation apparatus.

Figure 7A:
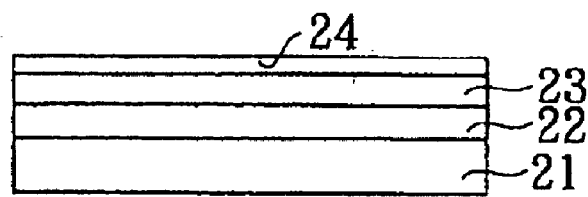
FIGS. 7A to 7F show process diagrams illustrating a method of manufacturing a TFT according to a second embodiment of the present invention.

In the method of manufacturing a TFT in this example, a transparent insulating substrate 21 made of glass which is cleaned by ultrasonic cleaning and the like (e.g., No. 1737 of Corning Incorporated, or the like) is prepared, as shown in FIG. 7A.

Next, in the LPCVD apparatus, an underlying protection film 22 of silicon oxide with thickness of, for example, 1500 Å (150 nm), is formed on the transparent insulating substrate 21 by LPCVD.

Next, an amorphous silicon semiconductor film with thickness of, for example, 500 Å (50 nm), is formed on the underlying protection film 22 by LPCVD.

In this example, the film deposition is performed under the following conditions: pressure of 10 Pa, substrate temperature 450° C., and gas introduction of $Si_2H_6$ of 200 sccm as a material gas.

Next, in the laser irradiation apparatus, excimer laser light is scan-irradiated on the amorphous silicon semiconductor film to make it crystalline, and thus a polysilicon semiconductor film 23 is formed.

In this example, the energy density of the excimer laser light is set to 410 mJ/cm², and the scan overlapping rate is set to 90% of beam width, for example.

Next, the transparent insulating substrate 21 having the semiconductor film 23 is removed from the laser irradiation apparatus and is then subjected to RCA cleaning processing and HF cleaning processing. More specifically, by using, as a cleaning liquid, a mixed solution of $NH_4OH$ solution, $H_2O_2$ solution, and $H_2O$ in a predetermined mixture ratio, or a mixed solution of HCl solution, $H_2O_2$ solution, and $H_2O$ in a predetermined mixture ratio, the transparent insulating substrate 21 is cleaned at 75° C. to 85° C. for 10 to 20 min., and is thereafter cleaned by the hydrofluoric acid (HF) solution as the cleaning liquid.

Next, within 10 min. after the above cleaning processing, a first gate oxide film 24 of silicon oxide with thickness of, for example, 100 Å (10 nm), is formed on the polysilicon semiconductor film 23 in the PECVD apparatus by PECVD.

Figure 7B:
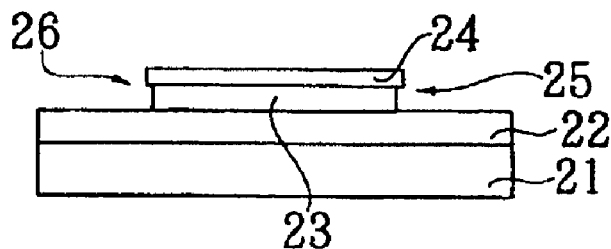

Next, a resist mask with a predetermined mask pattern is formed on the surface of the first gate oxide film 24, and using photolithography technique, the polysilicon semiconductor film 23 and the first gate oxide film 24 are etched and patterned together into island shape to form an island 25, as shown in FIG. 7B.

In this example also, the selectivity of polysilicon and silicon oxide (etching speed of polysilicon/etching speed of silicon oxide) is changed in the middle of forming the island 25, which means that etching is performed in two stages of different etching conditions.

More specifically, the selectivity of etching the first gate oxide film 24 and etching the polysilicon semiconductor film 23 in a region within approximately 400 Å (40 nm) in depth from its surface is set to, for example, 1, whereas the selectivity of etching the semiconductor film 23 in a region deeper than approximately 400 Å (40 nm) from its surface is set to, for example, 20.

In this example, as shown in FIG. 7B, an overhang part 26 is formed where the side end surface of the first gate oxide film 24 and that of the semiconductor film 23 are not aligned and the end part of the first gate oxide film 24 projects by approximately 1 μm from a position of the side end surface of the semiconductor film 23.

Next, the transparent insulating substrate 21 having the island 25 undergoes the RCA cleaning processing, and is then immersed in the aqueous hydrofluoric acid solution of concentration 0.5% for 10 sec. for cleaning to remove the overhang part 26 as well as dust.

Figure 7C:
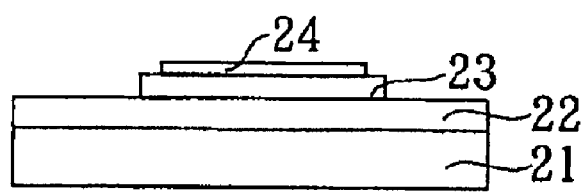

Consequently, the overhang part 26 is removed, and the side end surface of the first gate oxide film 24 is retracted by approximately 0.5 μm from the side end surface of the semiconductor film 23 to the center thereof, as shown in FIG. 7C.

In addition, the first gate oxide film 24 is etched so that it may remain with predetermined thickness (approximately 50 Å (5 nm) in this example), at least in a region directly under a gate electrode 28 which is formed in the subsequent process, that is, in a region directly above an area functioning as a channel of the semiconductor film 23.

Figure 7D:
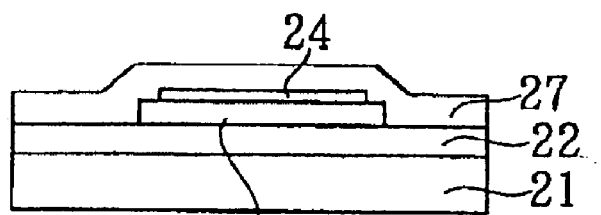
Figure 7E:
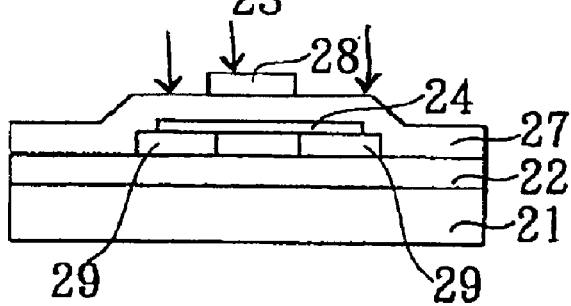

Next, as shown in FIG. 7D, a second gate oxide film 27 is formed on the transparent insulating substrate 21 having the semiconductor film 23 and the first gate oxide film 24 by PECVD. A conductive film composed of tantalum and the like is formed from above the second gate oxide film 27 by spattering or the like, and is then patterned using photolithography technique to form the gate electrode 28 on the second gate oxide film 27 as shown in FIG. 7E.

Next, using the gate electrode 28 as a mask, an impurity ion such as a phosphorus ion is implanted into the polysilicon semiconductor film 23 to form source/drain areas 29 as shown in FIG. 2E.

Figure 7F:
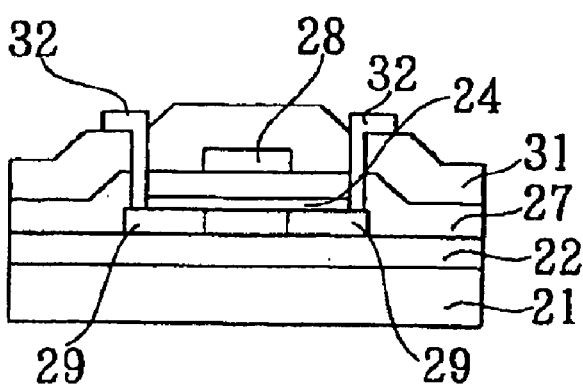

Next, as shown in FIG. 7F, an interlayer insulating film 31 of silicon oxide is formed by PECVD.

Next, contact holes are formed, after which source/drain electrodes 32 are formed connected to the source/drain areas 29.

Measurement of carrier mobility in the transparent insulating substrate 21 having the above TFT provides an excellent result of 290 cm$^2$/Vs on the average. In addition, calculation of standard deviation/average value for evaluation of less variations (uniformity) of the carrier mobility in the transparent insulating substrate 21 provides a result of 5% or below. Furthermore, a yield of 99% or more is attained.

According to the constitution in this example, the substantially same effects with those in the first embodiment described above can be obtained.

Furthermore, in substitution for the TFT manufacturing apparatus capable of performing the film deposition and laser irradiation in the same apparatus, different apparatus are used for each of the film deposition and laser irradiation, which enables constituting a manufacturing apparatus inexpensively.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

For example, in the forgoing embodiments, it is described the case where the TFT in the present invention is used as a switching element and the like of liquid crystal displays, however, it is not limited to liquid crystal displays, and the TFT may alternatively be applied to organic EL displays and the like.

In addition, it is described in the above first embodiment the case where the spin-cleaning is performed dropping the aqueous hydrofluoric acid solution of concentration 1% for 30 sec., and rotating the transparent insulating substrate 1 at the number of rotations of 200 rpm as a preferable example, however, cleaning conditions are not restricted to those and may appropriately be changeable, for example, it may alternatively be possible that the aqueous hydrofluoric acid solution of concentration 0.01% is dropped for 60 sec., or also that the aqueous hydrofluoric acid solution of concentration 10% is dropped for 1 second. Under such conditions, the overhang part 8 can be removed, thus enhancing the yield.

Furthermore, the number of rotations is not limited to 200 rpm and may be changeable, for example, within several 10%, without changing the concentration and drop time of the aqueous hydrofluoric acid solution, or may alternatively be changed in combination with the concentration or drop time.

Moreover, cleaning conditions are set depending on the thickness and the like of the first gate oxide film 6.

It is described the case where the aqueous hydrofluoric acid solution is used as a cleaning liquid, however, it may alternatively be possible that an aqueous buffered hydrofluoric acid solution including NH$_4$F as a buffer solution is used, for example.

The etching condition and film deposition condition are also not limited to those described above, and the selectivity of etching the first gate oxide film 6 and etching the polysilicon semiconductor film 5 in the region within approximately 400 Å (40 nm) in depth from its surface, and the selectivity of etching the semiconductor film 5 in the region deeper than approximately 400 Å (40 nm) from its surface, are not limited to 1, 20, respectively, and those may appropriately be changeable. The etching condition and film deposition condition are set depending on the thickness and the like of the first gate oxide film 6 and the semiconductor film 5.

Moreover, description will be made in connection with the second embodiment about the case where the transparent insulating substrate 1 is immersed in the aqueous hydrofluoric acid solution of concentration 0.5% for 10 sec. As a preferable example, however, the concentration of and immersion time in the aqueous hydrofluoric acid solution may appropriately be changeable and are set optimally depending on the thickness and the like of the first gate oxide film 6. For example, it may alternatively be possible that the transparent insulating substrate 1 is immersed in the aqueous hydrofluoric acid solution of concentration 0.01% for 60 sec., or immersed in the aqueous hydrofluoric acid solution of concentration 10% for 1 second.

Furthermore, in the embodiments described above, it may alternatively be possible to form the first and second gate insulating films by, for example, depositing silicon nitride instead of silicon oxide.

Alternatively, the gate electrode may be formed by the use of metals, such as aluminum, chromium, molybdenum, or the like, instead of tantalum.

Alternatively, the semiconductor film may be formed by amorphous silicon instead of polysilicon, and in this case the overhang part can be positively removed.

As described above, according to the present invention, the overhang part formed in the island forming process can be positively removed, thus enhancing the yield.

Besides, a clean interface between polysilicon and silicon oxide can be formed, so that high carrier mobility and high uniformity thereof can be achieved.

In addition, at least from the start of annealing process until the end of insulating film forming process, processing is performed in a separated state from the outside air, so that the interface between the polycrystalline semiconductor film and the oxide silicon film can particularly be maintained cleanly.

Furthermore, the overhang part is removed simultaneously with cleaning in the cleaning process, which eliminates a special process as well as additional time for only removing the overhang part. Therefore, the time necessary to manufacture TFTs can be reduced.

What is claimed is:

1. A method of manufacturing a thin film transistor, comprising the steps of:

forming a first insulating film on a semiconductor film formed on a substrate;

forming an island by patterning the semiconductor film and the first insulating film into an island shape, resulting in an overhang part, wherein a side end part of said first insulating film is formed into a visor shape over a side end part of said semiconductor film;

forming a second insulating film on the island;

forming a gate electrode on the second insulating film; and removing the overhang part;

wherein the step of removing the overhang part is performed after the step of forming the island and before the step of forming the second insulating film.

2. The method of manufacturing the thin film transistor according to claim 1, wherein in the step of removing the overhang part, the overhang part is removed by using a chemical cleaning liquid.

3. The method of manufacturing the thin film transistor according to claim 2, wherein in the step of removing the overhang part, the overhang part is removed by cleaning the substrate having the formed island for a time period from 1 to 60 seconds using an aqueous hydrofluoric acid solution of concentration ranging from 0.01% to 10% as the chemical cleaning liquid.

4. The method of manufacturing the thin film transistor according to claim 1, wherein the step of removing the overhang part is carried out so that the first insulating film is partially left at least on a region positioned under an area where the gate electrode is to be formed in the step of forming the gate electrode.

5. A method of manufacturing a thin film transistor, comprising the steps of:
   forming a first insulating film on a semiconductor film formed on a substrate;
   forming an island by patterning the semiconductor film and the first insulating film into an island shape, resulting in an overhang part, wherein a side end part of the first insulating film making the island is formed into a visor shape over a side end part of the semiconductor film;
   cleaning the substrate on which the island is formed;
   forming a second insulating film on the island; and
   forming a gate electrode on the second insulating film,
   wherein the step of cleaning is also performed to remove the overhang part.

6. The method of manufacturing the thin film transistor according to claim 5, wherein in the step of cleaning, the overhang part is removed by using a chemical cleaning liquid.

7. The method of manufacturing the thin film transistor according to claim 6, wherein in the step of cleaning, the overhang part is removed by cleaning the substrate having the formed island for a time period from 1 to 60 seconds using an aqueous hydrofluoric acid solution of concentration ranging from 0.01% to 10% as the chemical cleaning liquid.

8. The method of manufacturing the thin film transistor according to claim 5, wherein the step of cleaning is carried out so that the first insulating film is partially left at least on a region positioned under an area where the gate electrode is formed in the step of forming the gate electrode.

9. The method of manufacturing the thin film transistor according to claim 1, wherein the semiconductor film comprises a polycrystalline semiconductor.

10. The method of manufacturing the thin film transistor according to claim 9, further comprising:
    a semiconductor film forming step, which includes forming a semiconductor film of a non-single crystal semiconductor on the substrate and annealing the semiconductor film to form a polycrystalline semiconductor film.

11. The method of manufacturing the thin film transistor according to claim 10, wherein the non-single crystal semiconductor includes an amorphous semiconductor.

12. The method of manufacturing the thin film transistor according to claim 10, wherein the polycrystalline semiconductor film is formed by irradiating the non-single crystal semiconductor with laser light.

13. The method of manufacturing the thin film transistor according to claim 10, wherein processing through the formation of the first insulating film is performed in an inert atmosphere.

14. The method of manufacturing the thin film transistor according to claim 5, wherein the semiconductor film comprises a polycrystalline semiconductor.

15. The method of manufacturing the thin film transistor according to claim 14, further comprising:
    a semiconductor film forming step, which includes a non-single crystal semiconductor film forming step of forming a semiconductor film of a non-single crystal semiconductor on the substrate and an annealing step of crystallizing the semiconductor film of the non-single crystal semiconductor to form the semiconductor film of the polycrystalline semiconductor through annealing processing.

16. The method of manufacturing the thin film transistor according to claim 15, wherein the non-single crystal semiconductor includes an amorphous semiconductor.

17. The method of manufacturing the thin film transistor according to claim 15, wherein in the annealing step, the semiconductor film of the polycrystalline semiconductor is formed by irradiating the semiconductor film of the non-single crystal semiconductor with laser light.

18. The method of manufacturing the thin film transistor according to claim 15, wherein from the start of the annealing step until the end of the step of forming the first insulating film, predetermined processing is performed in an inert atmosphere.

* * * * *